United States Patent
Kamata

(10) Patent No.: US 7,629,794 B2
(45) Date of Patent: Dec. 8, 2009

(54) LEAKAGE DETECTION CIRCUIT AND BATTERY ELECTRONIC CONTROL UNIT

(75) Inventor: Seiji Kamata, Miyagi (JP)

(73) Assignee: Keihin Corporation, Tokyo (JP)

( * ) Notice: Subject to any disclaimer, the term of this patent is extended or adjusted under 35 U.S.C. 154(b) by 309 days.

(21) Appl. No.: 11/725,550

(22) Filed: Mar. 20, 2007

(65) Prior Publication Data
US 2007/0241758 A1   Oct. 18, 2007

(30) Foreign Application Priority Data
Mar. 23, 2006   (JP) ............................. 2006-081599

(51) Int. Cl.
*G01R 31/14* (2006.01)
(52) U.S. Cl. .......................... 324/509; 324/503; 361/45
(58) Field of Classification Search ................. 324/503, 324/509, 522, 693; 361/45
See application file for complete search history.

(56) References Cited

U.S. PATENT DOCUMENTS

| | | | |
|---|---|---|---|
| 7,176,693 B2* | 2/2007 | Tsuchiya, Naoya | 324/509 |
| 2003/0155928 A1* | 8/2003 | Roden et al. | 324/509 |
| 2005/0270034 A1* | 12/2005 | Tsuchiya | 324/509 |

FOREIGN PATENT DOCUMENTS

| | | |
|---|---|---|
| JP | 6-153303 | 5/1994 |
| JP | 2002-325302 | 11/2002 |

* cited by examiner

*Primary Examiner*—Vincent Q Nguyen
(74) *Attorney, Agent, or Firm*—Kratz, Quintos & Hanson, LLP

(57) ABSTRACT

A leakage detection circuit includes a branch having a body ground, a protective resistance, a switch element, a detection resistance, and a variable power supply that are coupled in series. A low voltage side of the variable power supply is connected to a negative electrode of a power supply device that is a subject for observation. Under control of the computer, the variable power supply outputs the voltage of 0 (zero) volt for detecting the leakage on a high voltage side and the voltage of 10-odd volts for detecting the leakage on the low voltage side. A leakage current is determined by amplifying a voltage across the detection resistance. A reference potential is not the body ground but the negative electrode of the power supply device, making it possible to configure the circuit in a relatively simply by using one detection circuit with one switch element having high voltage resistance.

6 Claims, 5 Drawing Sheets

LEAKAGE DETECTION CIRCUIT AND BATTERY ELECTRONIC CONTROL UNIT

CROSS-REFERENCE TO RELATED APPLICATION(S)

This application claims the foreign priority benefit under Title 35, United States Code, §119(a)-(d), of Japanese Patent Application No. 2006-81599, filed on Mar. 23, 2006 in the Japan Patent Office, the disclosure of which is herein incorporated by reference in its entirety.

BACKGROUND OF THE INVENTION

1. Field of the Invention

The present invention relates to a system for detecting an electric leakage between a high-voltage direct-current power supply and a body of a vehicle having the power supply.

2. Description of the Related Art

A high-voltage direct-current power supply such as a high-voltage battery or a fuel cell, which is mounted on electric, hybrid, and fuel-cell vehicles or the like, is not usually connected to the earth in order to prevent electric shock. Such a high-voltage direct-current power supply isolated from the earth needs to be monitored on its leakage resistance so as to promptly deal with the electric leakage between the power supply and the earth. There have been proposed various techniques for detecting a leakage resistance.

For example, Japanese Laid-open Patent Application Hei.6-153303 (paragraph [0010]; FIG. 1) discloses a leakage detection apparatus wherein a leakage detection circuit is provided on each of positive and negative electrode sides of a high-voltage direct-current power supply, and a changeover switch is provided between the leakage detection circuits and an earth. The apparatus includes a pair of a protective resistance and a leakage detection resistance, the changeover switch, a voltage measuring unit, and a leakage determination unit. A pair of the protective resistance and the leakage detection resistance, which are connected in series, is coupled to each of the positive and negative electrode sides of the power supply mounted on a vehicle and separated from a body ground of the vehicle. The changeover switch selectively grounds one end of each leakage detection resistance to the body ground. The voltage measuring unit measures a voltage of the power supply separated from the body ground. The leakage determination unit determines the leakage by voltage or current values on the opposed ends of each leakage detection resistance.

Japanese Laid-open Patent Application No. 2002-325302 (paragraph [0015]; FIG. 2) discloses a leakage detection apparatus for an electric vehicle. The leakage detection apparatus includes a first leakage detection circuit, a second leakage detection circuit, and a control circuit. The first leakage detection circuit detects the presence or absence of an electric leakage of a power supply device. The second leakage detection circuit detects a magnitude of a leakage resistance of the power supply device when the leakage is detected. The control circuit switches the second leakage detection circuit into a leakage resistance detection mode when the first leakage detection circuit detects the leakage of the power supply device. In the apparatus, the first leakage detection circuit detects the presence or absence of the leakage of the power supply device. When the leakage is detected, the control circuit switches the second leakage detection circuit into the leakage resistance detection mode, and then the second leakage detection circuit detects a magnitude of the leakage resistance of the power supply device.

The above-mentioned leakage detection apparatuses, however, use a separate leakage detection circuit for detecting the leakage on the positive and negative electrode sides, which results in the complexity of the circuit. Furthermore, in the apparatus disclosed in Japanese Laid-open Patent Application Hei.6-153303, the body ground is used as a reference to carry out the leakage detection. High voltage is applied to a changeover switch, which is an alternative switch, and therefore the switch corresponds to two ON/OFF switches. Because theses leakage detection apparatuses require a plurality of switch elements having high voltage resistance as mentioned above, the apparatuses are undesirable in view of the size and the cost.

SUMMARY OF THE INVENTION

The present invention has an object of providing a leakage detection circuit that is configured in a relatively simple manner without using a plurality of switch elements having high voltage resistance, and a battery electric control unit.

According to one aspect of the present invention, there is provided a leakage detection circuit that detects an electric leakage between a power supply device and a conductor containing a higher-level device which is supplied with a power by the power supply device. The leakage detection circuit of the present invention is the one that detects the leakage between the power supply device and the conductor containing the higher-level device having the power supply device. The leakage detection circuit includes a branch (for example, a branch 2 in FIGS. 1, 3, 4, and 5), one end of which is connected to a negative electrode of the power supply device and another end of which to the conductor. The branch has a series-connected circuit including a protective resistance, a switch element, a current detection resistance, and a variable power voltage supplying unit (for example, a variable power supply 40). The protective resistance prevents an excessive electric current from flowing through the branch. The switch element opens and closes the branch in response to a first control signal which transmits a detection timing. The current detection resistance detects the current flowing through the branch. The variable power voltage supplying unit outputs a voltage for detecting the leakage on a positive electrode side (high voltage side) of the power supply device and a voltage for detecting the leakage on a negative electrode side (low voltage side) of the power supply device in response to a second control signal which selects the positive or negative electrode side. The leakage detection circuit further includes an amplifier that amplifies a voltage between both ends of the current detection resistance and a computer that outputs the first and second control signals and determines a leakage current or a leakage resistance based on an output of the amplifier.

The leakage detection circuit of the present invention alternately switches an output of the variable power voltage supplying unit depending on the leakage detection on the high or low voltage side, thereby using the common circuit for detecting the leakage on the high and low voltage sides, which simplifies the circuit.

According to a second aspect of the present invention, the leakage detection circuit includes the computer having a unit for outputting the first control signal to turn on the switch element only upon the leakage detection (for example, in steps S1 and S6). The computer also includes a unit for determining the leakage current or the leakage resistance on the positive and negative electrode sides by using an output from the amplifier when the variable power voltage supplying unit outputs the voltage for detecting the leakage on the positive electrode side, and an output from the amplifier when the variable power voltage supplying unit outputs the voltage for detecting the leakage on the negative electrode side (for example, in steps S2 to S5).

The leakage detection circuit flows the current through the branch only upon the leakage detection, thereby saving the electricity.

According to a third aspect of the present invention, the leakage detection circuit further includes a second branch (for example, a series connection 4 in FIG. 5) having a series connection of a second protective resistance and a diode, the second branch connected in parallel with the protective resistance. The diode is arranged in such a direction so as to prevent a current, which flows due to a leakage on the positive electrode side of the power supply device, from flowing therethrough.

In the leakage detection circuit, it is possible to keep the same level of the current flowing through the branch upon the leakage detection of each of the high and low voltage sides or each of the positive and negative electrode sides by adjusting a resistance value of the second resistance. It is, therefore, advantageous for operations of the amplifier.

According to a fourth aspect of the present invention, there is provided a battery electric control unit (battery ECU) having the leakage detection circuit, wherein the higher-level device is a vehicle, the conductor containing the higher-level device is a vehicle body, and the power supply device is a high-voltage direct-current power supply.

According to the present invention, it is possible to configure a leakage detection circuit in a relatively simple manner without using a plurality of switch elements having high voltage resistance.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

Figure 1:
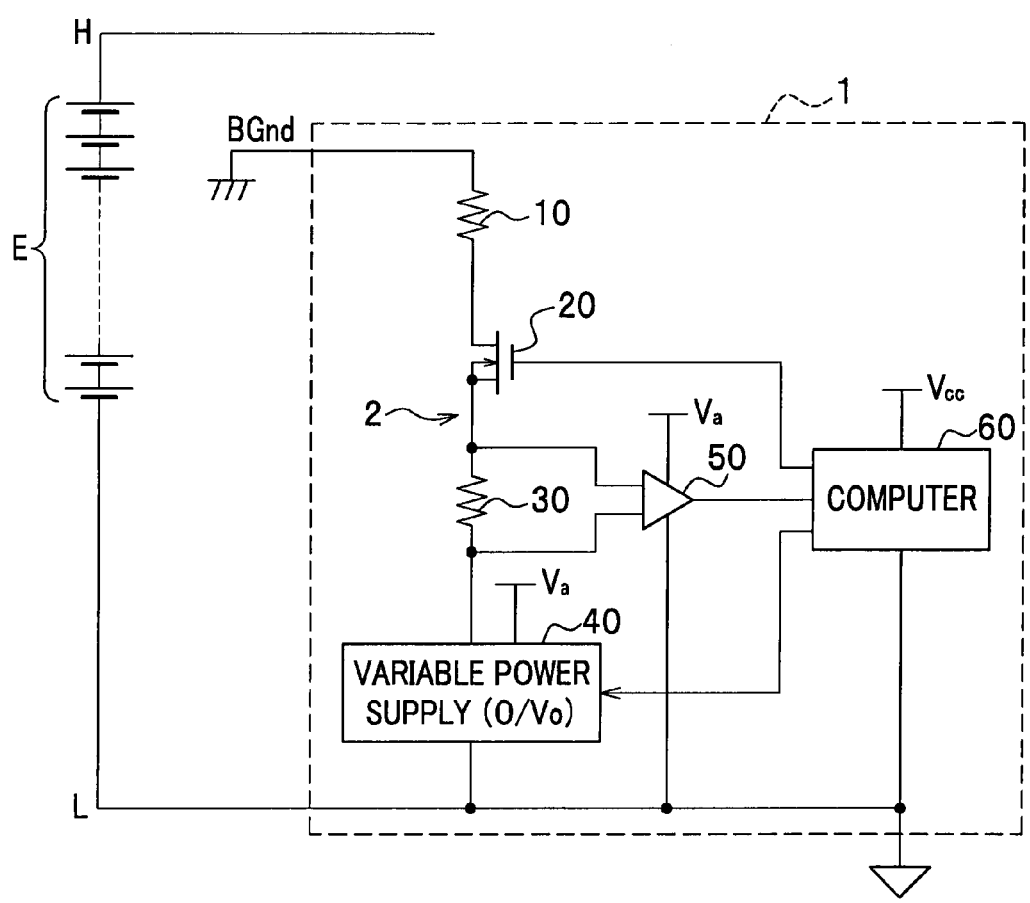
FIG. 1 is a circuit diagram schematically illustrating a configuration of a leakage detection circuit according to the principle of the present invention.

Hereinafter, an embodiment of the present invention will be described in detail with reference to the attached drawings.

The same components will be denoted by the same references in the drawings.

FIG. 1 is a circuit diagram schematically illustrating a configuration of a leakage detection circuit according to the principle of the present invention. In FIG. 1, the reference mark E denotes a power supply device to be used in a higher-level device (not shown), such as a vehicle, and be electrically isolated from a conductor or a grounded conductor containing the higher-level device. The power supply device is usually a high-voltage direct-current power supply. When the higher-level device is a vehicle, for example, a conductor containing the vehicle is a vehicle body, which is referred to as a body ground BGnd. The electric potential of a positive electrode of the power supply device E is denoted by H, and the electric potential of a negative electrode of the device E is denoted by L. The reference numeral 1 denotes a leakage detection circuit that detects an electric leakage between the power supply device E and the body ground BGnd according to the principle of the present invention.

The leakage detection circuit 1 includes a protective resistance 10, a switch element 20, a detection resistance 30, and a variable power supply 40 that are coupled in series. The leakage detection circuit 1 further includes a branch coupled between the negative electrode of the power supply device E and the body ground BGnd to detect a leakage current flowing therebetween. Specifically, the leakage detection circuit 1 includes the protective resistance 10, the switch element 20, the detection resistance 30, the variable power supply (variable power voltage supplying unit) 40, an amplifier 50, and a computer 60. The protective resistance 10 has one end thereof connected to the body ground BGnd and limits an electric current to prevent an excessive electric current from flowing through the branch. The switch element 20 has one of its channel electrodes connected to another end of the protective resistance 10. The detection resistance 30 has one end thereof connected to another channel electrode of the switch element 20 and detects the current flowing through the branch via a channel of the switch element 20. The variable power supply 40 is coupled between another end of the detection resistance 30 and the negative electrode of the power supply device E to provide a predetermined electrical potential difference therebetween. The amplifier 50 amplifies the voltage between both ends of the detection resistance 30. The computer 60 outputs a first control signal for transmitting a detection timing to a control terminal of the switch element 20 and a second control signal for instructing the variable power supply 40 to switch an output voltage, and determines a leakage resistance based on an output of the amplifier 50.

Among the components used in the leakage detection circuit 1, the switch element 20 is the only one to which a high voltage is applied. The switch element 20 opens and closes the branch in response to the first control signal from the computer 60. A switching speed of the switch element 20 is not taken into consideration and may be slow in the leakage detection circuit 1. Therefore, relays or various semiconductor elements, which sufficiently have high voltage resistance for an output voltage (H-L) of the power supply device E and conductivity having a satisfactory switching property, may be used as the switch element 20. An example of the switch element 20 is, but is not limited to, a MOSFET (metal-oxide semiconductor field-effect transistor) in this specification.

When the leakage (leakage on a high voltage side) exists between the positive electrode of the power supply device E and the body ground BGnd, the high potential H of the power supply device E is applied to a drain terminal of the switch element 20 and the low potential L of the device E is applied to a source terminal of the switch element 20. In the leakage detection circuit 1 configured as above, however, the high voltage (H-L) is not applied in the reverse direction between the source and drain terminals of the switch element 20. Therefore, it is sufficient to provide the switch element 20 with voltage resistance for the high voltage (H-L) in one direction between the source and drain terminals.

The variable power supply 40 outputs the voltage of 0 (zero) volt for detecting the leakage on the high voltage side and the voltage of Vo volt for detecting the leakage on the low voltage side in response to the second control signal from the computer 60. The voltage of Vo volt for detecting the leakage on the low voltage side may be 10-odd volts, for example 15 volts.

To simplify an explanation, the amplifier 50 is schematically illustrated by using only one operational amplifier, but the amplifier 50 may be configured with a plurality of operational amplifiers. The electric current flows through the detection resistance 30 in opposite directions upon the leakage detection on the high and low voltage sides. Accordingly, a voltage between both ends of the detection resistance 30 becomes reversed. As will be understood by a skilled person in the art, it is desirable to effectively use a dynamic range of the amplifier 50 by changing a reference voltage of the amplifier 50 in accordance with a direction of the current flowing through the detection resistance 30.

The computer 60 may be any appropriate well-known computer having a CPU, ROM, and RAM (not shown) or the like. The computer 60 is supplied with a power supply voltage Vcc, similarly to the power supply voltage supplied to a general digital integrated circuit. The variable power supply 40 and the amplifier 50 are supplied with a voltage Va based on a low-voltage battery of the vehicle, which is the higher-level device.

Figure 2:
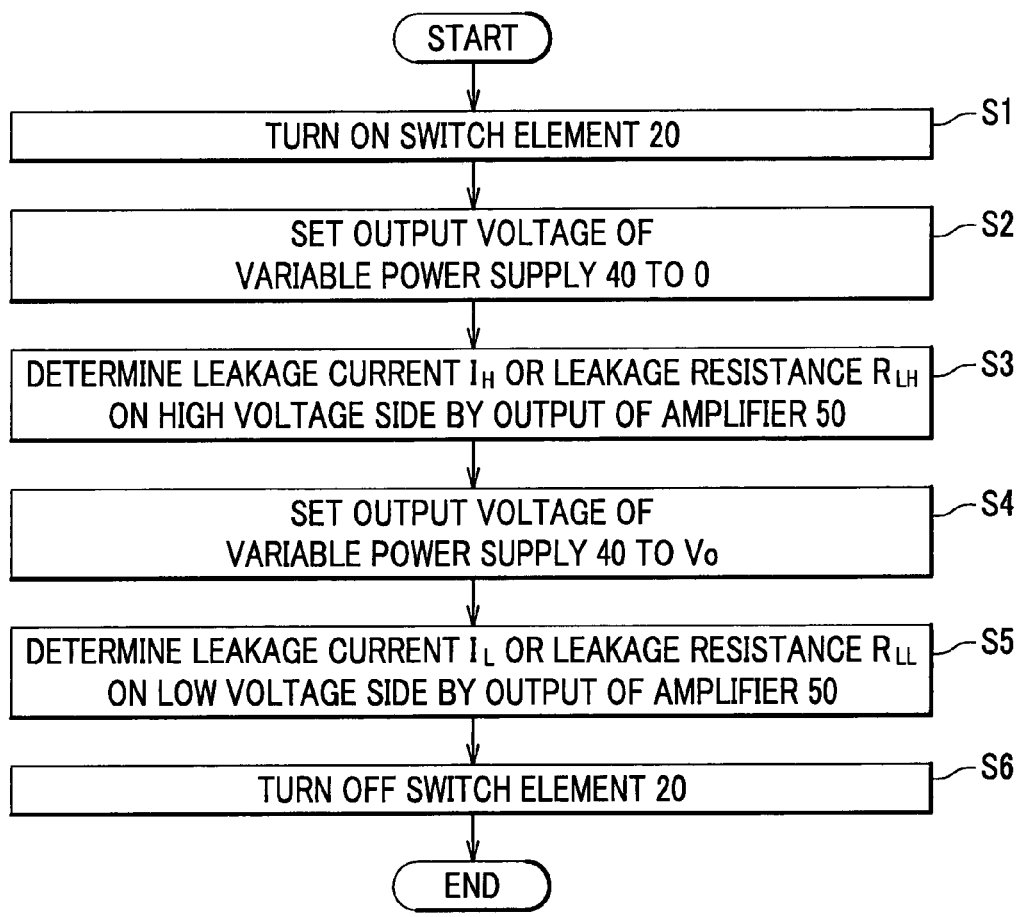
FIG. 2 is a flowchart illustrating operations of a computer 60 shown in FIG. 1.
Figure 3:
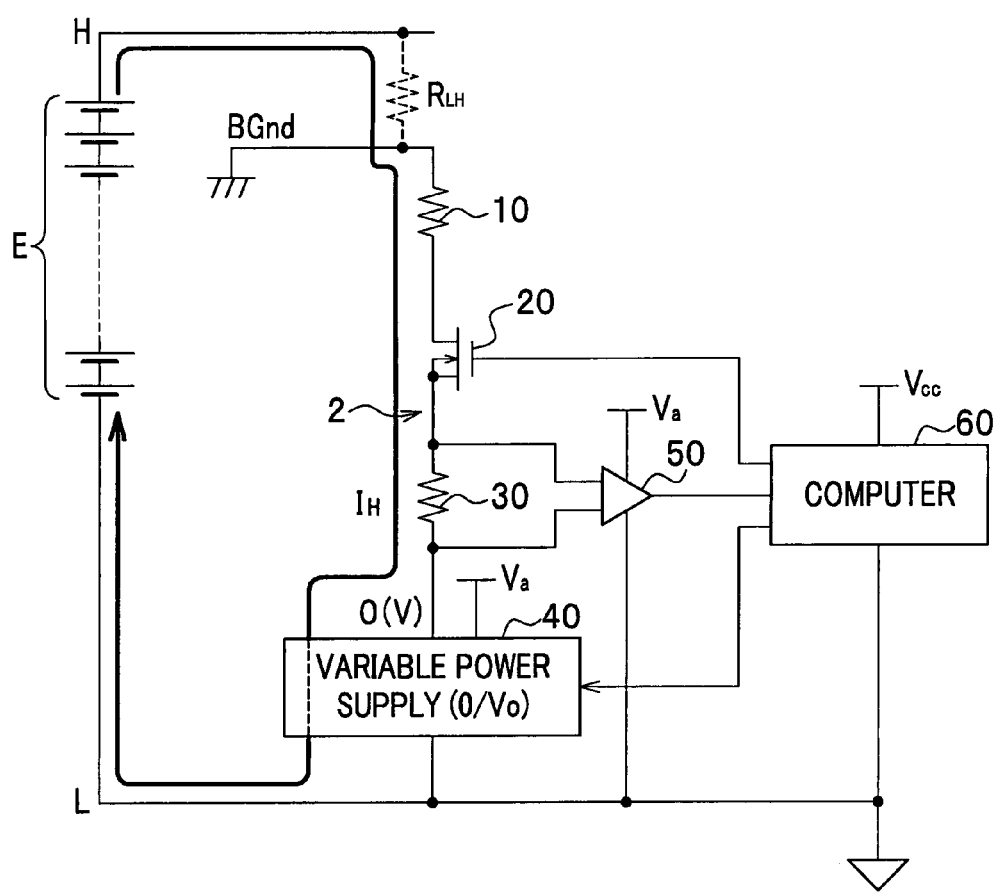
FIG. 3 illustrates a leakage detection mode on a high voltage side by the leakage detection circuit shown in FIG. 1.
Figure 4:
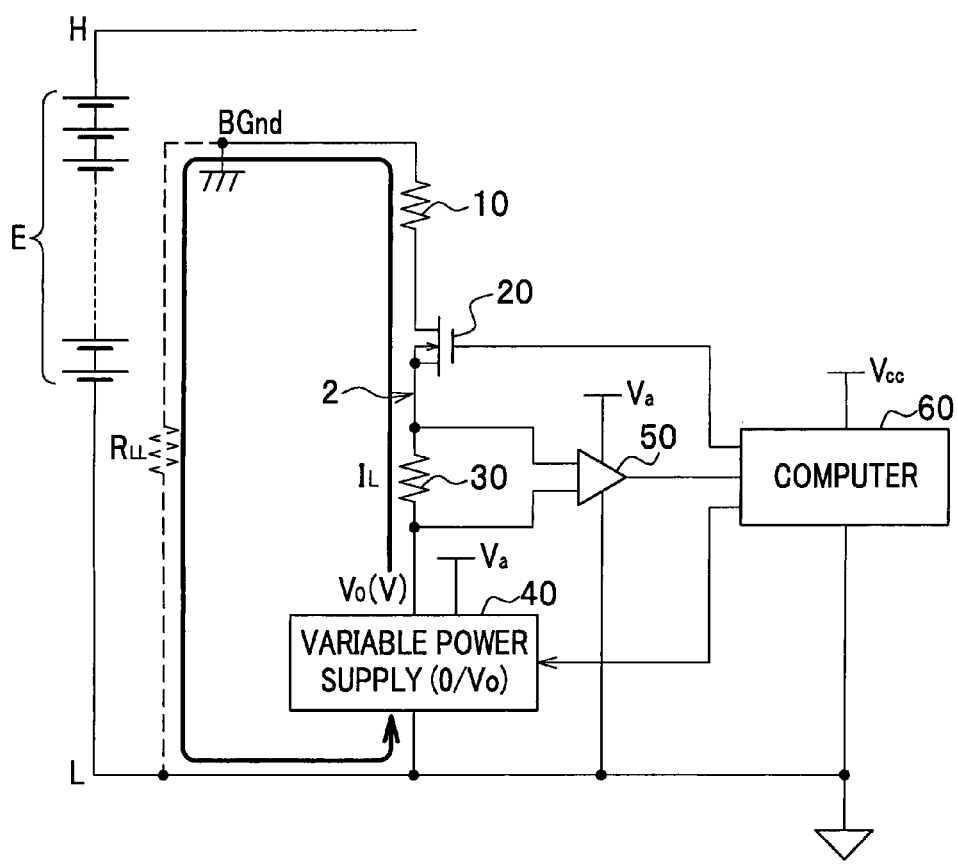
FIG. 4 illustrates a leakage detection mode on a low voltage side by the leakage detection circuit shown in FIG. 1.

A description will be given on operations of the leakage detection circuit 1 configured as above with reference to FIGS. 2 to 4. FIG. 2 is a flowchart illustrating operations of the computer 60 shown in FIG. 1. FIG. 3 illustrates a leakage detection mode on the high voltage side by the leakage detection circuit 1 shown in FIG. 1. FIG. 4 illustrates a leakage detection mode on the low voltage side by the leakage detection circuit 1 shown in FIG. 1.

In the computer 60 are stored programs for performing the process shown in the flowchart of FIG. 2. The computer 60 invokes the program from a ROM not shown to carry out a process in compliance with, for example, an operation of an unshown ignition switch or a command from the higher-level device. In the initial setting operation where the ignition switch is turned on, the first control signal is set to a low level by the computer 60 so as to turn off the switch element 20.

After the program is invoked, the unshown CPU of the computer 60 turns on the switch element 20 by the first control signal in step S1. In step S2, an output voltage of the variable power supply 40 is set to the voltage of 0 (zero) volt for detecting the leakage on the high voltage side by the second control signal, thereby entering a leakage detection mode on the high voltage side. As shown in FIG. 3, when the positive electrode of the power supply device E and the body ground $BG_{nd}$ are not completely isolated from each other and therefore a measurable floating resistance (herein referred to as a leakage resistance) $R_{LH}$ exists, the voltage (H-L) of the power supply device E causes an electric current (a leakage current) $I_H$ to flow through a closed circuit in the direction indicated by the heavy-line arrow. The closed circuit includes, in series, the power supply device E, the leakage resistance $R_{LH}$, the body ground BGnd, the resistance 10, the switch element 20, the detection resistance 30, and the variable power supply 40. In step S3, the leakage current $I_H$ due to the leakage on the high voltage side or the leakage resistance $R_{LH}$ on the high voltage side is determined by an output from the amplifier 50 that amplifies a voltage, which is generated between both ends of the detection resistance 30 due to the leakage current $I_H$.

In step S4, an output voltage of the variable power supply 40 is set to the voltage of Vo volt for detecting the leakage on the low voltage side by the second control signal, thereby entering a leakage detection mode on the low voltage side.

As shown in FIG. 4, when the negative electrode of the power supply device E and the body ground BGnd are not completely isolated form each other and therefore a measurable floating resistance or a leakage resistance $R_{LL}$ exists, the output voltage Vo of the variable power supply 40 causes a leakage current $I_L$ to flow through a closed circuit in the direction indicated by the heavy-line arrow. The closed circuit includes, in series, the variable power supply 40, the detection resistance 30, the switch element 20, the resistance 10, the body ground BGnd, and the leakage resistance $R_{LH}$. In step S5, the leakage current $I_L$ due to the leakage on the low voltage side or the leakage resistance $R_{LL}$ on the low voltage side is determined by an output from the amplifier 50 that amplifies a voltage, which is generated between both ends of the detection resistance 30 due to the leakage current $I_L$. In step S6, the switch element 20 is turned off by the first control signal, thereby terminating the leakage detection process shown in FIG. 2.

According to the present invention as described above, a reference potential of the leakage detection circuit 1 is not the body ground BGnd but the electric potential L of the negative electrode of the power supply device E, and a leakage current flows through the common branch including the body ground BGnd, the resistance 10, the switch element 20, the detection resistance 30, and the variable power supply 40 upon a leakage detection of each of the high and low voltage sides. Therefore, the leakage detection circuit 1 may have one detection circuit with one switch element having high voltage resistance, thereby making it possible to determine the leakage current or the leakage resistance by a circuit configured in a relatively simple manner.

In the leakage detection circuit 1 of FIG. 1, the high voltage (H-L) of the power supply device E is used for detecting the leakage on the high voltage side and the output voltage Vo of the variable power supply 40 is used for detecting the leakage on the low voltage side. The leakage current flows through the same branch upon a leakage detection on the high or low voltage side. A magnitude of the electric current flowing through the branch greatly depends on the voltage (H-L) and the voltage Vo, which accordingly varies the voltage levels detected by the detection resistance 30 considerably. For this reason, it is necessary to adjust the measurement range of the amplifier 50 upon a leakage detection of each of the high and low voltage sides. It is, therefore, advantageous to flow a similar magnitude of the electric current through the branch although the different voltages, namely the voltage (H-L) and Vo, are applied.

Figure 5:
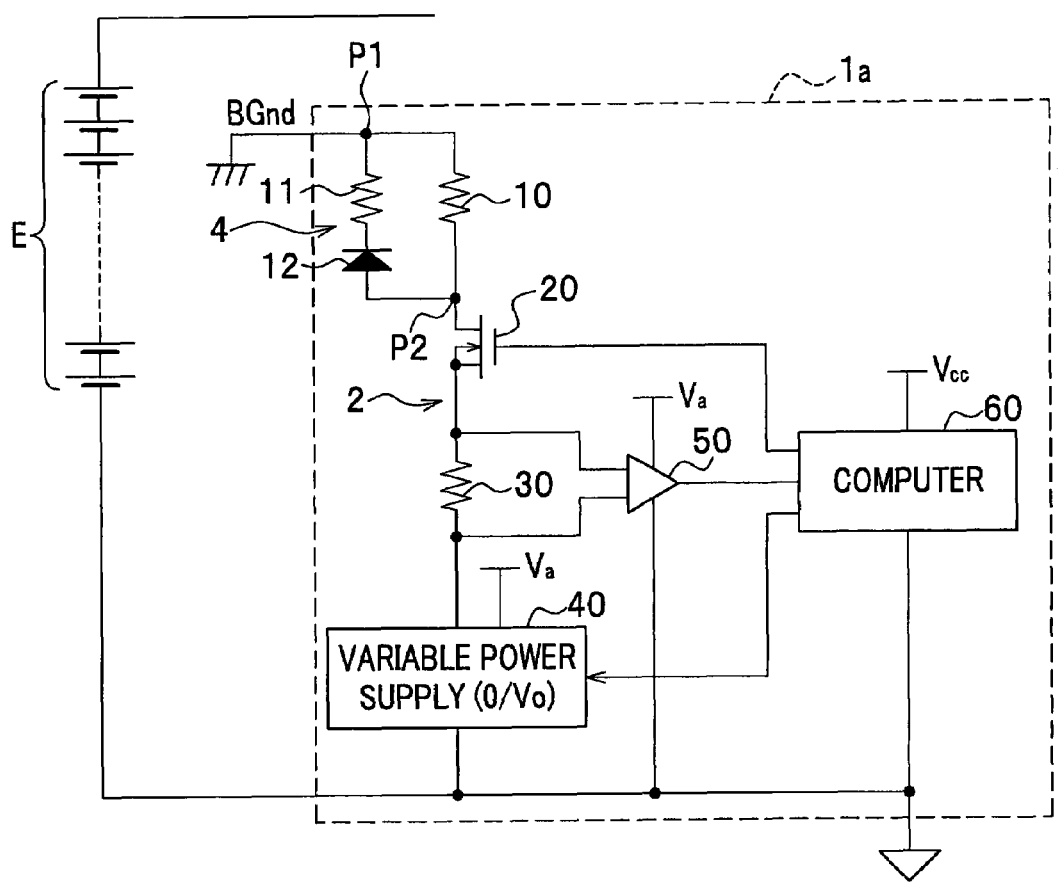
FIG. 5 is a circuit diagram schematically illustrating a configuration of the leakage detection circuit according to an embodiment of the present invention.

FIG. 5 is a circuit diagram schematically illustrating a configuration of the leakage detection circuit according to an embodiment of the present invention in order to solve the above object. The leakage detection circuit 1a of FIG. 5 has the same configuration as that of the leakage detection circuit 1 of FIG. 1, except that the protective resistance 10 is connected in parallel to a series connection 4 (a second branch in claim 3) of a resistance 11 (a second resistance in claim 3) and a diode 12. The both ends of the protective resistance 10 are denoted by P1 and P2, respectively. The diode 12 is connected in such a direction that the electric current does not flow therethrough because a voltage is applied to the diode 12 in the reverse direction when the connection point P1 between the protective resistance 10 and the body ground BGnd is a high potential and the point P2 is a low potential. Because a voltage is applied to the diode 12 in the reverse direction upon the leakage detection on the high voltage side, a resistance value between the points P1 and P2 is a resistance value of the protective resistance 10. On the contrary, because a voltage is applied to the diode 12 in the forward direction upon the leakage detection on the low voltage side, a resistance value between the points P1 and P2 is a resistance value of the series connection of the protective resistance 10 and the resistance 11. It is, therefore, possible to keep the same level of the electric current flowing through the branch by adjusting a resistance value of the resistance 11 upon the leakage detection of each of the high and low voltage sides.

To simplify an explanation, the above description assumes that the leakage does not occur on the low voltage side when the leakage is detected on the high voltage side, and the leakage does not occur on the high voltage side when the leakage is detected on the low voltage side. However, there is a possibility that a measurable leakage occurs on both of the high and low voltage sides simultaneously. In order to solve such a situation, a simultaneous equation is formed by an output from the amplifier 50 when the variable power supply 40 outputs a voltage for detecting the leakage on each of the high and low voltage sides. The simultaneous equation uses resistance values of the protective resistance 10, the detection resistance 30 and the switch element 20, an internal resistance value of the variable power supply 40, an output voltage of the power supply device E, and an output voltage Vo of the variable power supply 40. The leakage resistance $R_{LH}$ on the high voltage side and the leakage resistance $R_{LL}$ on the low voltage side are unknown values in the equation. The leakage resistance $R_{LH}$ and $R_{LL}$ are determined from the solution of the simultaneous equation.

The above-described embodiment is only an example for explaining the present invention. It is, therefore, easy for a skilled person in the art to make various changes, modifications or additions in the above embodiment within the scope of the technical idea and the principle of the present invention.

For example, the components of the branch including the protective resistance 10, the switch element 20, the detection resistance 30, and the variable power supply 40, which are connected in series, may be arranged in any order.

What is claimed is:

1. A leakage detection circuit that detects an electric leakage between a power supply device and a conductor containing a higher-level device which is supplied with a direct-current power by the power supply device,
   the leakage detection circuit comprises:
   a branch, one end of which is connected to a negative electrode of the power supply device and another end of which to the conductor;
   the branch including a series-connected circuit having:
   a protective resistance that prevents an excessive electric current from flowing through the branch;
   a switch element that opens and closes the branch in response to a first control signal which transmits a detection timing;
   a current detection resistance that detects a current flowing through the branch; and
   a variable power voltage supplying unit that outputs a voltage for detecting leakage on a positive electrode side of the power supply device and a voltage for detecting leakage on a negative electrode side of the power supply device in response to a second control signal which selects the positive or negative electrode side,
   the leakage detection circuit further including:
   an amplifier that amplifies a voltage between both ends of the current detection resistance; and
   a computer that outputs the first and second control signals and determines a leakage current or a leakage resistance based on an output from the amplifier.

2. A battery electric control unit including the leakage detection circuit according to claim 1,
   wherein the higher-level device is a vehicle,
   the conductor containing the higher-level device is a vehicle body, and
   the power supply device is a high-voltage direct-current power supply.

3. A leakage detection circuit that detects an electric leakage between a power supply device and a conductor containing a higher-level device which is supplied with a direct-current power by the power supply device,
   the leakage detection circuit comprises:
   a branch, one end of which is connected to a negative electrode of the power supply device and another end of which to the conductor;
   the branch including a series-connected circuit having:
   a protective resistance that prevents an excessive electric current from flowing through the branch;
   a switch element that opens and closes the branch in response to a first control signal which transmits a detection timing;
   a current detection resistance that detects a current flowing through the branch; and
   a variable power voltage supplying unit that outputs a voltage for detecting leakage on a positive electrode side of the power supply device and a voltage for detecting leakage on a negative electrode side of the power supply device in response to a second control signal which selects the positive or negative electrode side,
   the leakage detection circuit further including:
   an amplifier that amplifies a voltage between both ends of the current detection resistance; and
   a computer that outputs the first and second control signals and determines a leakage current or a leakage resistance based on an output from the amplifier,
   wherein the computer comprises:
   a unit for outputting the first control signal to turn on the switch element only upon the leakage detection; and
   a unit for determining the leakage current or the leakage resistance on the positive and negative electrode sides by using an output from the amplifier when the variable power voltage supplying unit outputs the voltage for detecting the leakage on the positive electrode side, and an output from the amplifier when the variable power voltage supplying unit outputs the voltage for detecting the leakage on the negative electrode side.

4. The leakage detection circuit according to claim 3 further comprising:
   a second branch including a series connection of a second protective resistance and a diode, the second branch connected in parallel with the protective resistance,
   wherein the diode is arranged in such a direction so as to prevent a current, which flows due to a leakage on the positive electrode side of the power supply device, from flowing therethrough.

5. A battery electric control unit including the leakage detection circuit according to claim 3,
   wherein the higher-level device is a vehicle,
   the conductor containing the higher-level device is a vehicle body, and
   the power supply device is a high-voltage direct-current power supply.

6. A leakage detection circuit that detects an electric leakage between a power supply device and a conductor containing a higher-level device which is supplied with a direct-current power by the power supply device,
   the leakage detection circuit comprises:

a branch, one end of which is connected to a negative electrode of the power supply device and another end of which to the conductor;

the branch including a series-connected circuit having:

a protective resistance that prevents an excessive electric current from flowing through the branch;

a switch element that opens and closes the branch in response to a first control signal which transmits a detection timing;

a current detection resistance that detects a current flowing through the branch; and a variable power voltage supplying unit that outputs a voltage for detecting leakage on a positive electrode side of the power supply device and a voltage for detecting leakage on a negative electrode side of the power supply device in response to a second control signal which selects the positive or negative electrode side, the leakage detection circuit further including:

an amplifier that amplifies a voltage between both ends of the current detection resistance; and a computer that outputs the first and second control signals and determines a leakage current or a leakage resistance based on an output from the amplifier, further comprising:

a second branch including a series connection of a second protective resistance and a diode, the second branch connected in parallel with the protective resistance, wherein the diode is arranged in such a direction so as to prevent a current, which flows due to a leakage on the positive electrode side of the power supply device, from flowing therethrough.

* * * * *